United States Patent
Nobe

(10) Patent No.: US 10,778,100 B2
(45) Date of Patent: Sep. 15, 2020

(54) POWER SUPPLY DEVICE

(71) Applicant: TOYOTA JIDOSHA KABUSHIKI KAISHA, Toyota-shi, Aichi-ken (JP)

(72) Inventor: Daigo Nobe, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/166,828

(22) Filed: Oct. 22, 2018

(65) Prior Publication Data

US 2019/0123651 A1 Apr. 25, 2019

(30) Foreign Application Priority Data

Oct. 23, 2017 (JP) ................. 2017-204395

(51) Int. Cl.
| | |
|---|---|
| *H02M 3/158* | (2006.01) |
| *B60L 3/00* | (2019.01) |
| *H02P 23/14* | (2006.01) |
| *B60L 50/51* | (2019.01) |
| *H02P 27/14* | (2006.01) |
| *G01R 23/15* | (2006.01) |
| *H02P 27/06* | (2006.01) |

(52) U.S. Cl.
CPC .......... *H02M 3/1584* (2013.01); *B60L 50/51* (2019.02); *G01R 23/15* (2013.01); *H02P 23/14* (2013.01); *H02P 27/06* (2013.01); *H02P 27/14* (2013.01); *B60L 2210/14* (2013.01); *B60L 2210/42* (2013.01); *B60L 2240/421* (2013.01)

(58) Field of Classification Search
CPC ........ H02M 3/1584; B60L 3/003; H02P 23/14
See application file for complete search history.

(56) References Cited

U.S. PATENT DOCUMENTS

| | | | |
|---|---|---|---|
| 5,214,358 A * | 5/1993 | Marshall | B60K 6/30 318/139 |
| 6,509,712 B1 | 1/2003 | Landis | |
| 2002/0057076 A1 | 5/2002 | Hwang | |
| 2011/0132899 A1* | 6/2011 | Shimomugi | H02M 3/1584 219/620 |
| 2012/0224401 A1* | 9/2012 | Phadke | H02M 3/1584 363/84 |
| 2012/0229061 A1* | 9/2012 | Itoh | B60L 3/003 318/400.3 |

FOREIGN PATENT DOCUMENTS

| | | |
|---|---|---|
| DE | 10216252 A1 | 11/2003 |
| JP | 2010-104139 A | 5/2010 |
| JP | 2012-210138 A | 10/2012 |
| JP | 2013-90401 A | 5/2013 |

* cited by examiner

*Primary Examiner* — Cortez M Cook
(74) *Attorney, Agent, or Firm* — Sughrue Mion, PLLC

(57) ABSTRACT

A power supply device is equipped with a first boost converter including a first reactor of a first inductance and with a second boost converter including a second reactor of a second inductance that is a different value from the first inductance, as converters that are connected in parallel to each other and configured to transmit electric power with conversion of voltage between a power storage device side and an electric load side. The first boost converter and the second boost converter have different resonance frequencies. This configuration suppresses the occurrence of resonance with a load variable frequency of the electric load.

1 Claim, 4 Drawing Sheets

POWER SUPPLY DEVICE

CROSS-REFERENCE TO RELATED APPLICATIONS

The present disclosure claims priority to Japanese Patent Application No. 2017-204395 filed Oct. 23, 2017, which is incorporated herein by reference in its entirety including specification, drawings and claims.

TECHNICAL FIELD

The present disclosure relates to a power supply device and more specifically relates to a power supply device including a plurality of boost converters that are connected in parallel to each other and that are configured to transmit electric power with conversion of a voltage between a power storage device side and an electric load side.

BACKGROUND

A proposed configuration of a power supply device mounted on a vehicle includes two boost converters that are connected in parallel to each other and that are placed between a battery and a motor for driving (as described in, for example, JP 2010-104139A). This device uses the two boost converters with switching over the drive mode between a mode in which only one boost converter is driven and a mode in which two boost converters are driven.

SUMMARY

In the power supply device of the above configuration, however, when the two boost converters have identical characteristics or more specifically when reactors respectively included in the two boost converters have identical inductances, the two boost converters have identical resonance frequencies. In the case where a load variable frequency of the motor is equal to the resonance frequencies of the two boost converters, in the drive mode that drives only one boost converter, resonance occurs whether only the first boost converter is driven or only the second boost converter is driven.

A power supply device of the present disclosure mainly aims to suppress the occurrence of resonance with a load variable frequency of an electric load.

In order to achieve the above primary object, the power supply device of the present disclosure employs the following configuration.

The present disclosure is directed to a power supply device. The power supply device includes a power storage device, a first boost converter provided to include a first reactor of a first inductance and configured to transmit electric power with conversion of voltage between the power storage device side and an electric load side, a second boost converter provided to include a second reactor of a second inductance, connected in parallel to the first boost converter relative to the electric load, and configured to transmit electric power with conversion of voltage between the power storage device side and the electric load side, a capacitor mounted on the electric load side of the first boost converter and the second boost converter and a control device configured to control the first boost converter and the second boost converter. The second inductance is different from the first inductance.

The power supply device of this aspect is equipped with the first boost converter configured to transmit power with conversion of voltage between the power storage device side and the electric load side and with the second boost converter connected in parallel to the first boost converter relative to the electric load. The second inductance of the second reactor included in the second boost converter is different from the first inductance of the first reactor included in the first boost converter. The first boost converter and the second boost converter accordingly have different resonance frequencies. This configuration can use the boost converter that does not cause resonance with the load variable frequency of the electric load. As a result, this suppresses the occurrence of resonance with the load variable frequency of the electric load.

DESCRIPTION OF EMBODIMENTS

Figure 1:
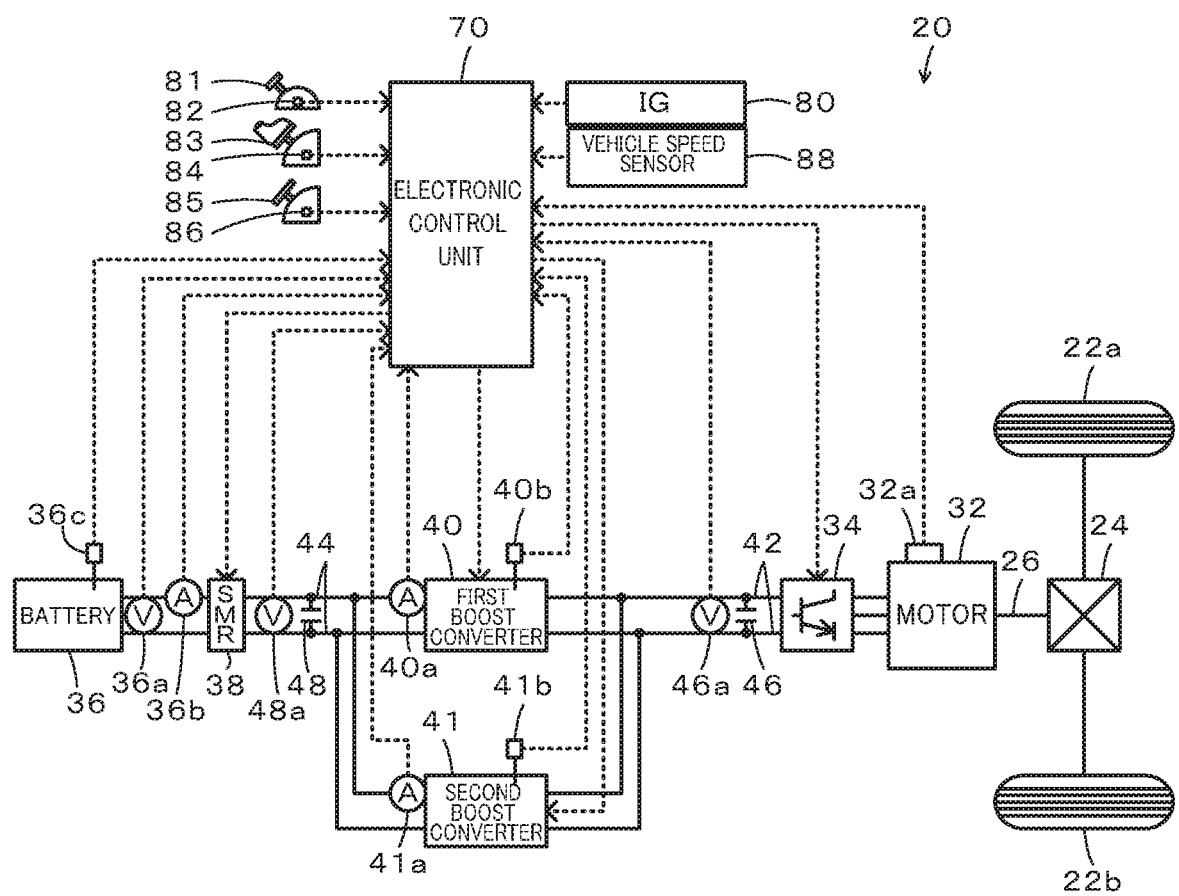
FIG. 1 is a configuration diagram illustrating the schematic configuration of an electric vehicle with a power supply device according to one embodiment of the present disclosure mounted thereon.
Figure 2:
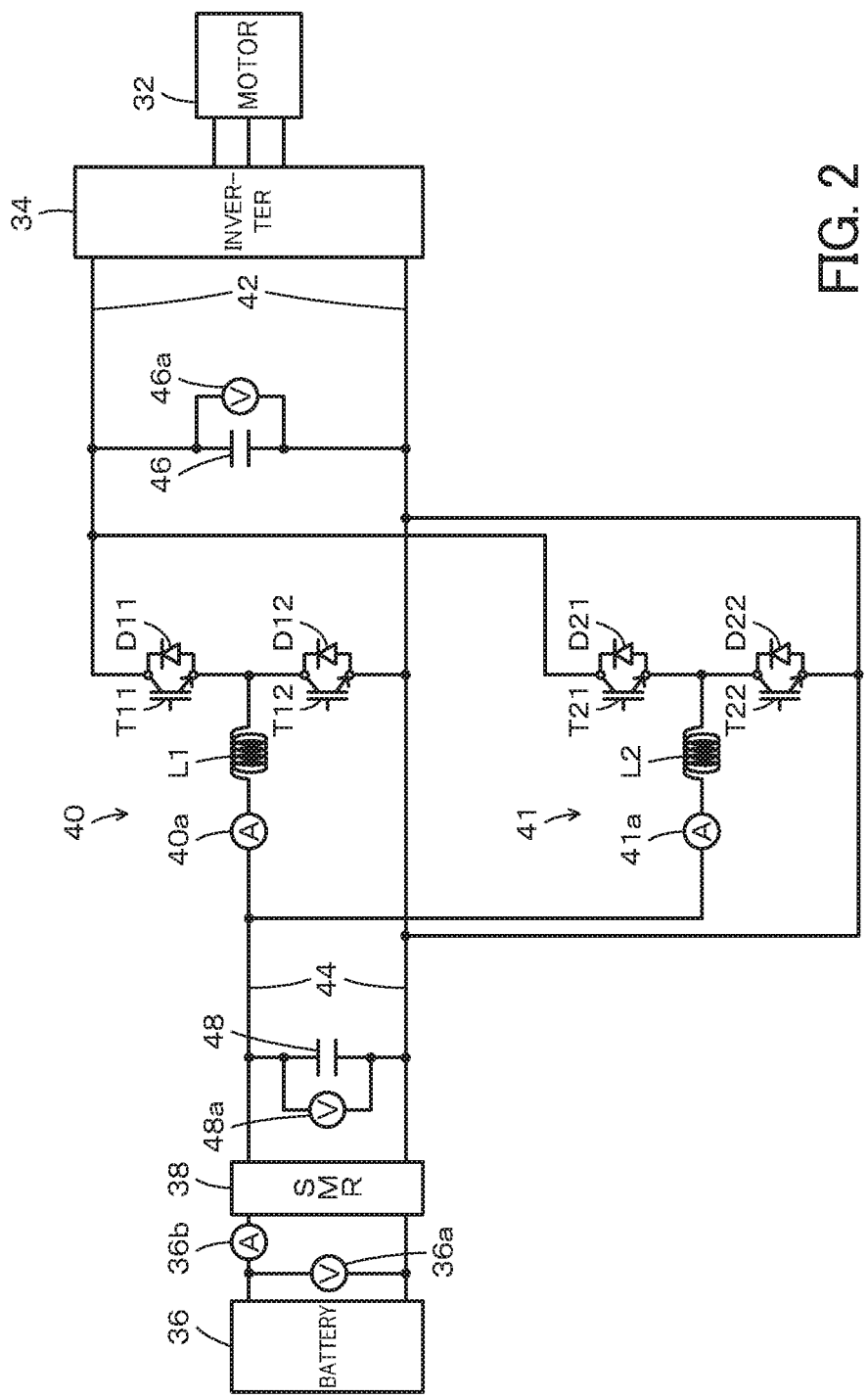
FIG. 2 is a configuration diagram illustrating the schematic configuration of an electric drive system including a motor.

The following describes some aspects of the present disclosure with referring to an embodiment. FIG. 1 is a configuration diagram illustrating the schematic configuration of an electric vehicle 20 with a power supply device according to one embodiment of the present disclosure mounted thereon. FIG. 2 is a configuration diagram illustrating the schematic configuration of an electric drive system including a motor 32. As shown in FIG. 1, the electric vehicle 20 of the embodiment includes a motor 32, an inverter 34, a battery 36 as a power storage device, first and second boost converters 40 and 41, and an electronic control unit 70. The battery 36, the first and second boost converters 40 and 41 and the electronic control unit 70 correspond to the power supply device according to the embodiment.

The motor 32 is configured as, for example, a synchronous generator motor and includes a rotor connected with a driveshaft 26 that is coupled with drive wheels 22a and 22b via a differential gear 24. The inverter 34 is connected with the motor 32 and with high voltage-side power lines 42. The electronic control unit 70 performs switching control of a plurality of switching elements (not shown) included in the inverter 34, so as to rotate and drive the motor 32. A capacitor 46 for smoothing is mounted to a positive electrode line and a negative electrode line of the high voltage-side power lines 42.

The battery 36 is configured as, for example, a lithium ion rechargeable battery or a nickel metal hydride battery and is connected with low voltage-side power lines 44 as second power lines. A system main relay 38 configured to connect and disconnect the battery 36 and a capacitor 48 for smoothing are mounted in this sequence from the battery 36-side to a positive electrode line and a negative electrode line of the low voltage-side power lines 44.

As shown in FIG. 2, the first boost converter 40 is connected with the high voltage-side power lines 42 and with the low voltage-side power lines 44 and is configured as a known step-up/down converter including two transistors T11 and T12, two diodes D11 and D12 and a reactor L1. The transistor T11 is connected with the positive electrode line of the high voltage-side power lines 42. The transistor T12 is connected with the transistor T11 and with the negative electrode lines of the high voltage-side power lines 42 and of the low voltage-side power lines 44. The reactor L1 is connected with a connection point between the transistors T11 and T12 and with the positive electrode line of the low voltage-side power lines 44. The electronic control unit 70 regulates the rate of ON time of the transistors T11 and T12 of the first boost converter 40, so that the first boost converter 40 supplies the power of the low voltage-side power lines 44 to the high voltage-side power lines 42 with stepping up the voltage of the power, while supplying the power of the high voltage-side power lines 42 to the low voltage-side power lines 44 with stepping down the voltage of the power. A resonance frequency fc1 of the first boost converter 40 may be calculated by using an inductance L1 of the reactor L1 of the first boost converter 40 and an electrostatic capacitance C of the capacitor 46 mounted to the high voltage-side power lines 42 according to Expression (1) given below:

[Math. 1]

$$fc1 = \frac{1}{2\pi\sqrt{L1 \cdot C}}, \quad (1)$$

The second boost converter 41 is configured as a boost converter having the same performance as that of the first boost converter 40 within a manufacturing error and the like. More specifically, like the first boost converter 40, the second boost converter 41 is connected with the high voltage-side power lines 42 and with the low voltage-side power lines 44 and is configured as a known step-up/down converter including two transistors T21 and T22, two diodes D21 and D22 and a reactor L2. The electronic control unit 70 regulates the rate of ON time of the transistors T21 and T22 of the second boost converter 41, so that the second boost converter 41 supplies the power of the low voltage-side power lines 44 to the high voltage-side power lines 42 with stepping up the voltage of the power, while supplying the power of the high voltage-side power lines 42 to the low voltage-side power lines 44 with stepping down the voltage of the power. A resonance frequency fc2 of the second boost converter 41 may be calculated according to Expression (2) given below, and a resonance frequency fc3 in the case where both the first boost converter 40 and the second boost converter 41 are driven may be calculated according to Expression (3) given below:

[Math. 2]

$$fc2 = \frac{1}{2\pi\sqrt{L2 \cdot C}} \quad (2)$$

$$fc3 = \frac{1}{2\pi\sqrt{\frac{L1 \cdot L2}{L1+L2} \cdot C}} \quad (3)$$

The electronic control unit 70 is configured as a CPU-based microprocessor and includes a ROM configured to store processing programs, a RAM configured to temporarily store data, a non-volatile flash memory and input/output ports, in addition to the CPU, although not being illustrated.

As shown in FIG. 1, signals from various sensors are input into the electronic control unit 70 via the input port. The signals input into the electronic control unit 70 include, for example, a rotational position θm from a rotational position detection sensor 32a configured to detect the rotational position of the rotor of the motor 32 and phase currents Iu and Iv from current sensors configured to detect electric currents flowing in the respective phases of the motor 32. The input signals also include a voltage Vb from a voltage sensor 36a mounted between terminals of the battery 36, an electric current Ib from a current sensor 36b mounted to an output terminal of the battery 36, and a battery temperature Tb from a temperature sensor 36c mounted to the battery 36. The input signals additionally include a voltage VH of the high voltage-side power lines 42 (capacitor 46) from a voltage sensor 46a mounted between terminals of the capacitor 46 and a voltage VL of the low voltage-side power lines 44 (capacitor 48) from a voltage sensor 48a mounted between terminals of the capacitor 48. The input signals further include electric currents IL1 and IL2 of the reactors L1 and L2 from current sensors 40a and 40b configured to detect electric currents flowing in the reactors L1 and L2 of the first and the second boost converters 40 and 41 and temperatures tc1 and tc2 of the first and the second boost converters 40 and 41 from temperature sensors 40b and 41b mounted to the first and the second boost converters 40 and 41. The input signals also include an ignition signal from an ignition switch 80 and a shift position SP from a shift position sensor 82 configured to detect an operating position of a shift lever 81. The input signals further include an accelerator position Acc from an accelerator pedal position sensor 84 configured to detect a depression amount of an accelerator pedal 83, a brake pedal position BP from a brake pedal position sensor 86 configured to detect a depression amount of a brake pedal 85, and a vehicle speed V from a vehicle speed sensor 88.

As shown in FIG. 1, various control signals are output from the electronic control unit 70 via the output port. The signals output from the electronic control unit 70 include, for example, switching control signals to the plurality of switching elements included in the inverter 34, switching control signals to the transistors T11 and T12 of the first boost converter 40, switching control signals to the transistors T21 and T22 of the second boost converter 41, and a drive control signal to the system main relay 38. The electronic control unit 70 calculates an electrical angle θe and a rotation speed Nm of the motor 32, based on the rotational position θm of the rotor of the motor 32 from the rotational position detection sensor 32a.

The electronic control unit 70 calculates a state of charge SOC of the battery 36, based on an integrated value of the electric current Ib of the battery 36 from the current sensor 36b. The electronic control unit 70 also calculates input and output limits Win and Wout that denote maximum allowable powers to be charged into and discharged from the battery 36, based on the calculated state of charge SOC and the battery temperature Tb from the temperature sensor 36c mounted to the battery 36. The state of charge SOC herein denotes a ratio of the capacity of electric power dischargeable from the battery 36 to the overall capacity of the battery 36.

In the electric vehicle 20 of the embodiment having the above configuration, the electronic control unit 70 first sets a required torque Td* that is required for driving (required for the driveshaft 26), based on the accelerator position Acc and the vehicle speed V, and multiplies the required torque Td* by a rotation speed of the driveshaft 26 to set a load power Pm which the motor 32 is required to output for driving. The electronic control unit 70 subsequently sets a torque command Tm* such that the load power Pm is output from the motor 32. The electronic control unit 70 then performs switching control of the switching elements included in the inverter 34, such as to output the torque command Tm*. The electronic control unit 70 also sets a target voltage VH* of the high voltage-side power lines 42, based on the torque command Tm*, and controls the first boost converter 40 and the second boost converter 41 to supply the load power Pm to the inverter 34 with stepping up the voltage of the power from the battery 36 to the target voltage VH*. The first boost converter 40 and the second boost converter 41 are controlled in a range of an allowed drive mode. When the load power Pm has a small value, only one boost converter is driven out of the first boost converter 40 and the second boost converter 41. When the load power Pm has a large value, on the other hand, both the first boost converter 40 and the second boost converter 41 are driven. According to the embodiment, a mode in which only the first boost converter 40 is driven is specified as first drive mode. A mode in which only the second boost converter 41 is driven is specified as second drive mode. A mode in which both the first boost converter 40 and the second boost converter 41 are driven is specified as third drive mode.

Figure 3:
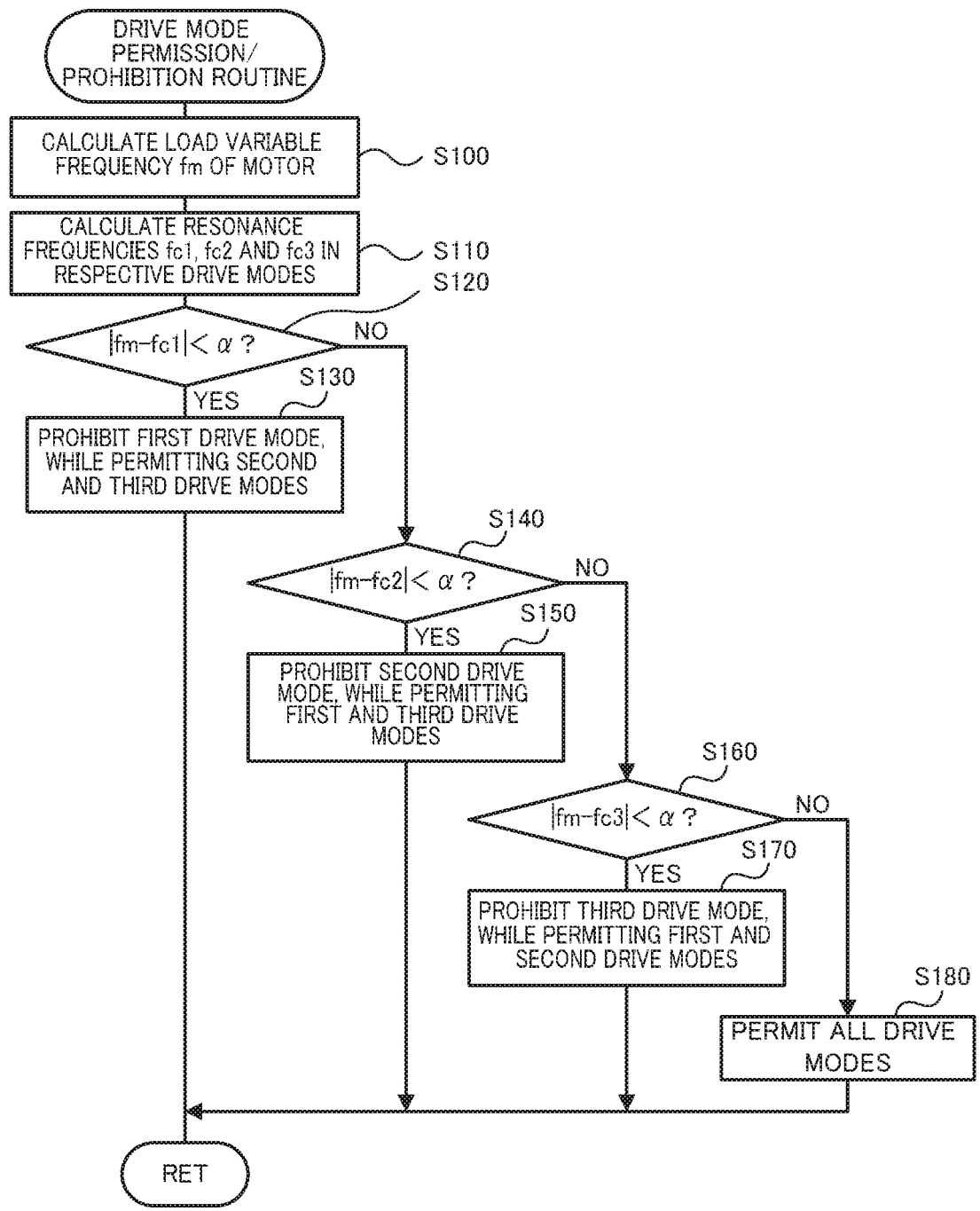
FIG. 3 is a flowchart showing one example of a drive mode permission/prohibition routine performed by an electronic control unit.

The following describes operations of the power supply device mounted on the electric vehicle 20 of the embodiment having the above configuration or more specifically a series of operations to suppress resonance based on a rotational frequency of the motor 32. FIG. 3 is a flowchart showing one example of a drive mode permission/prohibition routine performed by the electronic control unit 70. This routine is performed repeatedly at every predetermined time interval (for example, at every several tens msec).

Figure 4:
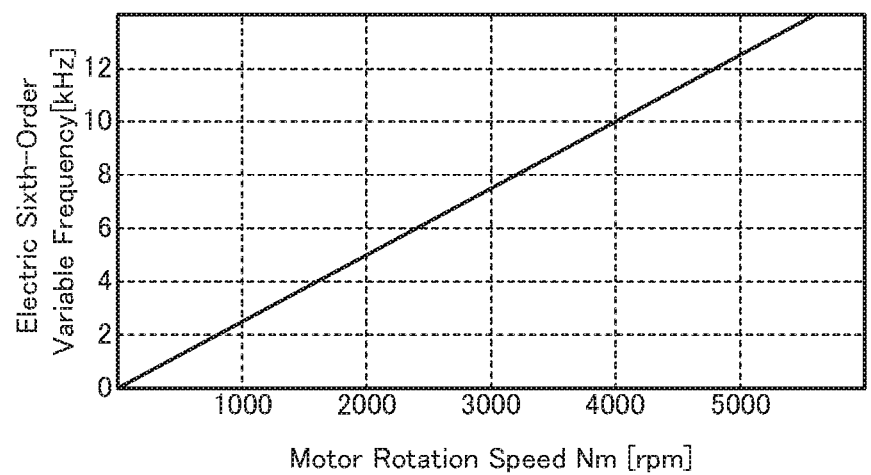
FIG. 4 is a diagram illustrating one example of a relationship of an electric sixth-order variable frequency to a motor rotation speed when the motor is a 4 pole-pair motor.

When the drive mode permission/prohibition routine is triggered, the electronic control unit 70 first calculates a load variable frequency fm of the motor 32 (step S100). According to the embodiment, a procedure of calculating the load variable frequency fm of the motor 32 specifies in advance a relationship between the rotation speed Nm and the load variable frequency fm of the motor 32, stores the specified relationship as a load variable frequency setting map, and reads a value of the load variable frequency fm corresponding to a given rotation speed Nm of the motor 32 from the map. FIG. 4 shows one example of a relationship of an electric sixth-order variable frequency to the motor rotation speed Nm when the motor 32 is a 4 pole-pair motor. When the motor 32 is a 4 pole-pair motor, the load variable frequency fm of the motor 32 is the electric sixth-order variable frequency. As shown in FIG. 4, the electric sixth-order variable frequency linearly changes against the rotation speed Nm of the motor 32. Accordingly, the load variable frequency fm is unequivocally determined against the rotation speed Nm of the motor 32.

The electronic control unit 70 subsequently calculates the resonance frequencies fc1, fc2 and fc3 in the respective drive modes of the first boost converter 40 and the second boost converter 41 (step S110). The resonance frequency fc1 in the first drive mode (i.e., mode in which only the first boost converter 40 is driven) is calculated according to Expression (1) given above. The resonance frequency fc2 in the second drive mode (i.e., mode in which only the second boost converter 41 is driven) is calculated according to Expression (2) given above. The resonance frequency fc3 in the third drive mode (i.e., mode in which both the first boost converter 40 and the second boost converter 41 are driven) is calculated according to Expression (3) given above.

The electronic control unit 70 subsequently determines whether a difference between the load variable frequency fm and the resonance frequency fc1 in the first drive mode (i.e., an absolute value of a difference by subtracting the resonance frequency fc1 from the load variable frequency fm) is less than a threshold value $\alpha$ (step S120). The threshold value $\alpha$ herein denotes a criterion value used to determine whether the load variable frequency fm is coincident with the resonance frequency fc1 and is set to a small positive value. More specifically, when the difference between the load variable frequency fm and the resonance frequency fc1 in the first drive mode is less than the threshold value $\alpha$, employing the first drive mode to control the first boost converter 40 and the second boost converter 41 causes resonance. When it is determined that the difference between the load variable frequency fm and the resonance frequency fc1 in the first drive mode is less than the threshold value $\alpha$, the electronic control unit 70 determines that driving the first boost converter 40 and the second boost converter 41 in the first drive mode causes resonance and thereby prohibits the first drive mode while permitting the second drive mode and the third drive mode (step S130), before terminating this routine. Accordingly, when the load power Pm has a small value, the control of the first boost converter 40 and the second boost converter 41 drives only the second boost converter 41. When the load power Pm has a large value, on the other hand, the control of the first boost converter 40 and the second boost converter 41 drives both the first boost converter 40 and the second boost converter 41. This configuration suppresses resonance caused by driving the first boost converter 40 and the second boost converter 41 in the first drive mode.

When it is determined at step S120 that the difference between the load variable frequency fm and the resonance frequency fc1 in the first drive mode is equal to or greater than the threshold value $\alpha$, the electronic control unit 70 subsequently determines whether a difference between the load variable frequency fm and the resonance frequency fc2 in the second drive mode (i.e., an absolute value of a difference by subtracting the resonance frequency fc2 from the load variable frequency fm) is less than the threshold value $\alpha$ (step S140). When it is determined that the difference between the load variable frequency fm and the resonance frequency fc2 in the second drive mode is less than the threshold value $\alpha$, the electronic control unit 70 determines that driving the first boost converter 40 and the second boost converter 41 in the second drive mode causes resonance and thereby prohibits the second drive mode while permitting the first drive mode and the third drive mode (step S150), before terminating this routine. Accordingly, when the load power Pm has a small value, the control of the first boost converter 40 and the second boost converter 41 drives only the first boost converter 40. When the load power Pm has a large value, on the other hand, the control of the first boost converter 40 and the second boost converter 41 drives both the first boost converter 40 and the second boost converter 41. This configuration suppresses resonance caused by driving the first boost converter 40 and the second boost converter 41 in the second drive mode.

When it is determined at step S140 that the difference between the load variable frequency fm and the resonance frequency fc2 in the second drive mode is equal to or greater than the threshold value α, the electronic control unit 70 subsequently determines whether a difference between the load variable frequency fm and the resonance frequency fc3 in the third drive mode (i.e., an absolute value of a difference by subtracting the resonance frequency fc3 from the load variable frequency fm) is less than the threshold value α (step S160). When it is determined that the difference between the load variable frequency fm and the resonance frequency fc3 in the third drive mode is less than the threshold value α, the electronic control unit 70 determines that driving the first boost converter 40 and the second boost converter 41 in the third drive mode causes resonance and thereby prohibits the third drive mode while permitting the first drive mode and the second drive mode (step S170), before terminating this routine. Accordingly, the control of the first boost converter 40 and the second boost converter 41 drives only one of the first boost converter 40 and the second boost converter 41, irrespective of the magnitude of the load power Pm. This configuration suppresses resonance caused by driving the first boost converter 40 and the second boost converter 41 in the third drive mode.

When it is determined at step S160 that the difference between the load variable frequency fm and the resonance frequency fc3 in the third drive mode is equal to or greater than the threshold value α, the electronic control unit 70 determines that no resonance occurs and permits all the drive modes (step S180), before terminating this routine. Accordingly, when the load power Pm has a small value, the control of the first boost converter 40 and the second boost converter 41 drives only one of the first boost converter 40 and the second boost converter 41. When the load power Pm has a large value, on the other hand, the control of the first boost converter 40 and the second boost converter 41 drives both the first boost converter 40 and the second boost converter 41.

The power supply device mounted on the electric vehicle 20 of the embodiment described above employs different settings for the inductance L1 of the reactor L1 of the first boost converter 40 and for the inductance L2 of the reactor L2 of the second boost converter 41. This configuration enables the boost converters to be driven without causing resonance with the load variable frequency fm of the motor 32. More specifically, the power supply device calculates the load variable frequency fm and the resonance frequencies fc1, fc2 and fc3 in the respective drive modes. When the difference between the load variable frequency fm and the resonance frequency fc1 in the first drive mode is less than the threshold value α, the power supply device prohibits the first drive mode, while permitting the second drive mode and the third drive mode. When the difference between the load variable frequency fm and the resonance frequency fc2 in the second drive mode is less than the threshold value α, the power supply device prohibits the second drive mode, while permitting the first drive mode and the third drive mode. When the difference between the load variable frequency fm and the resonance frequency fc3 in the third drive mode is less than the threshold value α, the power supply device prohibits the third drive mode, while permitting the first drive mode and the second drive mode. When all the differences between the load variable frequency fm and the resonance frequencies fc1, fc2 and fc3 in the respective drive modes are equal to or greater than the threshold value α, the power supply device permits all the drive modes. As a result, this configuration suppresses resonance with the load variable frequency fm of the motor 32.

The power supply device mounted on the electric vehicle 20 of the embodiment determines whether the difference between the load variable frequency fm and the resonance frequency fc1 in the first drive mode is less than the threshold value α. When the difference between the load variable frequency fm and the resonance frequency fc1 in the first drive mode is equal to or greater than the threshold value α, the power supply device subsequently determines whether the difference between the load variable frequency fm and the resonance frequency fc2 in the second drive mode is less than the threshold value α. When the difference between the load variable frequency fm and the resonance frequency fc2 in the second drive mode is equal to or greater than the threshold value α, the power supply device subsequently determines whether the difference between the load variable frequency fm and the resonance frequency fc3 in the third drive mode is less than the threshold value α. The sequence of the determinations of whether the differences between the load variable frequency fm and the respective resonance frequencies fc1, fc2 and fc3 in the respective drive modes are equal to or greater than the threshold value α is, however, not limited to the sequence of the first drive mode, the second drive mode and the third drive mode but may be any sequence.

The power supply device mounted on the electric vehicle 20 of the embodiment employs the identical value α for the respective drive modes as the threshold value used to determine whether the load variable frequency fm is coincident with the resonance frequency fc1, fc2 or fc3 in each of the drive modes. According to a modification, different values α1, α2 and α3 (where α1≠α2, α1≠α3, and α2≠α3) may be employed as threshold values for the respective drive modes.

The power supply device mounted on the electric vehicle 20 of the embodiment is equipped with two boost converters having different characteristics (different inductances of reactors), i.e., the first boost converter 40 and the second boost converter 41. The power supply device may be equipped with three or more boost converters having different characteristics.

The power supply device mounted on the electric vehicle 20 of the embodiment uses one battery 36 as a power storage device. The power storage device may be a capacitor used in place of the battery 36.

The embodiment describes the configuration of the power supply device mounted on the electric vehicle 20 that is driven with power from the motor 32. The present disclosure may also be implemented by the configuration of a power supply device mounted on a hybrid vehicle that is driven with the power from a motor and the power from an engine or by the configuration of a power supply device built in stationary equipment such as construction equipment.

In the power supply device of this aspect, the control device may control the first boost converter and the second boost converter by employing one drive mode among a plurality of drive modes including a first drive mode in which only the first boost converter is driven, a second drive mode in which only the second boost converter is driven and a third drive mode in which both the first boost converter and the second boost converter are driven. The first inductance of the first reactor included in the first boost converter is different from the second inductance of the second reactor included in the second boost converter. This provides different resonance frequencies in the first drive mode, in the second drive mode and in the third drive mode. In this case, a load variable frequency may denote a drive frequency of the electric load, a first resonance frequency may denote a resonance frequency in the first drive mode, a second resonance frequency may denote a resonance frequency in the second drive mode, and a third resonance frequency may denote a resonance frequency in the third drive mode. (1) When a difference between the load variable frequency and the first resonance frequency is less than a first threshold value, the control device may prohibit the first drive mode, while permitting the second drive mode and the third drive mode, (2) when a difference between the load variable frequency and the second resonance frequency is less than a second threshold value, the control device may prohibit the second drive mode, while permitting the first drive mode and the third drive mode, (3) when a difference between the load variable frequency and the third resonance frequency is less than a third threshold value, the control device may prohibit the third drive mode, while permitting the first drive mode and the second drive mode, and (4) when the difference between the load variable frequency and the first resonance frequency is equal to or greater than the first threshold value, the difference between the load variable frequency and the second resonance frequency is equal to or greater than the second threshold value, and the difference between the load variable frequency and the third resonance frequency is equal to or greater than the third threshold value, the control device may permit the first drive mode, the second drive mode and the third drive mode. This configuration enables the first boost converter and the second boost converter to be driven in the drive mode that does not cause resonance with the load variable frequency of the electric load. The first threshold value, the second threshold value and the third threshold value may be all different values or may be all an identical value, or any two of the threshold values may be an identical value.

The following describes the correspondence relationship between the primary components of the embodiment and the primary components of the disclosure described in Summary. The battery 36 of the embodiment corresponds to the "power storage device", the first boost converter 40 corresponds to the "first boost converter", the second boost converter 41 corresponds to the "second boost converter", the capacitor 46 corresponds to the "capacitor", and the electronic control unit 70 corresponds to the "control device". Further, the motor 32 and inverter 34 of the embodiment correspond to the "electric load".

The correspondence relationship between the primary components of the embodiment and the primary components of the disclosure, regarding which the problem is described in Summary, should not be considered to limit the components of the disclosure, regarding which the problem is described in Summary, since the embodiment is only illustrative to specifically describes the aspects of the disclosure, regarding which the problem is described in Summary. In other words, the disclosure, regarding which the problem is described in Summary, should be interpreted on the basis of the description in the Summary, and the embodiment is only a specific example of the disclosure, regarding which the problem is described in Summary.

The aspect of the disclosure is described above with reference to the embodiment. The disclosure is, however, not limited to the above embodiment but various modifications and variations may be made to the embodiment without departing from the scope of the disclosure.

INDUSTRIAL APPLICABILITY

The technique of the disclosure is preferably applicable to the manufacturing industries of the power supply device and so on.

The invention claimed is:

1. A power supply device according, comprising:

a power storage device;

a first boost converter provided to include a first reactor of a first inductance and configured to transmit electric power with conversion of voltage between the power storage device side and an electric load side;

a second boost converter provided to include a second reactor of a second inductance, connected in parallel to the first boost converter relative to the electric load, and configured to transmit electric power with conversion of voltage between the power storage device side and the electric load side;

a capacitor mounted on the electric load side of the first boost converter and the second boost converter; and a control device configured to control the first boost converter and the second boost converter, wherein the second inductance is different from the first inductance, the control device controls the first boost converter and the second boost converter by employing one drive mode among a plurality of drive modes including a first drive mode in which only the first boost converter is driven, a second drive mode in which only the second boost converter is driven and a third drive mode in which both the first boost converter and the second boost converter are driven, a load variable frequency denotes a drive frequency of the electric load, a first resonance frequency denotes a resonance frequency in the first drive mode, a second resonance frequency denotes a resonance frequency in the second drive mode, and a third resonance frequency denotes a resonance frequency in the third drive mode, and (1) when a difference between the load variable frequency and the first resonance frequency is less than a first threshold value, the control device prohibits the first drive mode, while permitting the second drive mode and the third drive mode, (2) when a difference between the load variable frequency and the second resonance frequency is less than a second threshold value, the control device prohibits the second drive mode, while permitting the first drive mode and the third drive mode, (3) when a difference between the load variable frequency and the third resonance frequency is less than a third threshold value, the control device prohibits the third drive mode, while permitting the first drive mode and the second drive mode, and (4) when the difference between the load variable frequency and the first resonance frequency is equal to or greater than the first threshold value, the difference between the load variable frequency and the second resonance frequency is equal to or greater than the second threshold value, and the difference between the load variable frequency and the third resonance frequency is equal to or greater than the third threshold value, the control device permits the first drive mode, the second drive mode and the third drive mode.

* * * * *